(12) United States Patent
Delaplagne

(10) Patent No.: US 9,632,143 B2
(45) Date of Patent: Apr. 25, 2017

(54) METHOD FOR EVALUATING THE STATE OF CHARGE OF A BATTERY

(71) Applicant: COMMISSARIAT A L'ENERGIE ATOMIQUE ET AUX ENERGIES ALTERNATIVES, Paris (FR)

(72) Inventor: Tony Delaplagne, Albertville (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/901,470

(22) PCT Filed: Jun. 24, 2014

(86) PCT No.: PCT/EP2014/063297
§ 371 (c)(1),
(2) Date: Dec. 28, 2015

(87) PCT Pub. No.: WO2014/206989
PCT Pub. Date: Dec. 31, 2014

(65) Prior Publication Data
US 2016/0187426 A1 Jun. 30, 2016

(30) Foreign Application Priority Data
Jun. 25, 2013 (FR) .................................... 13 56034

(51) Int. Cl.
*H01M 10/052* (2010.01)
*G01R 31/36* (2006.01)
(Continued)

(52) U.S. Cl.
CPC ....... *G01R 31/362* (2013.01); *G01R 31/3655* (2013.01); *H01M 10/052* (2013.01);
(Continued)

(58) Field of Classification Search
None
See application file for complete search history.

(56) References Cited

U.S. PATENT DOCUMENTS

| 5,061,898 A | 10/1991 | Oram et al. |
| 2005/0225301 A1 | 10/2005 | Arnold et al. |

(Continued)

FOREIGN PATENT DOCUMENTS

| JP | 2011-14395 A | 1/2011 |
| JP | 2011-15485 A | 1/2011 |

(Continued)

OTHER PUBLICATIONS

International Search Report (ISR) and Written Opinion dated Sep. 22, 2014 issued in corresponding application No. PCT/EP2014/063297; w/ English partial translation and machine translation (19 pages).

(Continued)

*Primary Examiner* — Patrick Ryan
*Assistant Examiner* — Wyatt McConnell
(74) *Attorney, Agent, or Firm* — Westerman, Hattori, Daniels & Adrian, LLP

(57) ABSTRACT

Method for evaluating the state of charge of a battery including at least one phase of estimating the state of charge of the battery by an estimation algorithm and at least one phase of resetting the estimation algorithm implemented during the estimation phase, which includes (i) detecting a real value of a state of charge of the battery at an instant, by (a) charging or discharging the battery, between first and second levels of state of charge; (b) measuring the voltage across the terminals of the battery during this charging or discharging; (c) evaluating the time derivative of the voltage; (d) detecting at least one particular point of this derivative corresponding to a known and predefined real value of state of charge, and (ii) resetting the estimation algorithm knowing the real value of state of charge at the given instant.

19 Claims, 5 Drawing Sheets

(51) Int. Cl.
    *H01M 10/44*    (2006.01)
    *H01M 10/48*    (2006.01)
    H01M 4/485    (2010.01)
    H01M 10/42    (2006.01)
(52) U.S. Cl.
    CPC ......... *H01M 10/441* (2013.01); *H01M 10/48* (2013.01); *H01M 10/482* (2013.01); *G01R 31/3637* (2013.01); *G01R 31/3651* (2013.01); *G01R 31/3679* (2013.01); *H01M 4/485* (2013.01); *H01M 2010/4271* (2013.01)

(56)    References Cited

U.S. PATENT DOCUMENTS

| 2007/0299620 A1 | 12/2007 | Yun et al. |
| 2012/0176092 A1 | 7/2012 | Fujii et al. |
| 2014/0009117 A1 | 1/2014 | Ishii et al. |

FOREIGN PATENT DOCUMENTS

| JP | 2012-145403 A | 8/2012 |
| KR | 20080000160 A | 1/2008 |
| WO | 2012/133274 A1 | 10/2012 |

OTHER PUBLICATIONS

International Preliminary Report on Patentability (IPRP) of the International Preliminary Examination Authority dated Apr. 22, 2015 issued in corresponding application No. PCT/EP2014/063297; w/ English machine translation (15 pages).

Korean Office Action dated Apr. 1, 2016 in counterpart Korean application No. 10-2016-7000918, English translation (2 pages).

Japanese Office Action dated Jul. 12, 2016 in corresponding Japanese application No. 2015-563114; English translation of notice of reasons for rejection (8 pages).

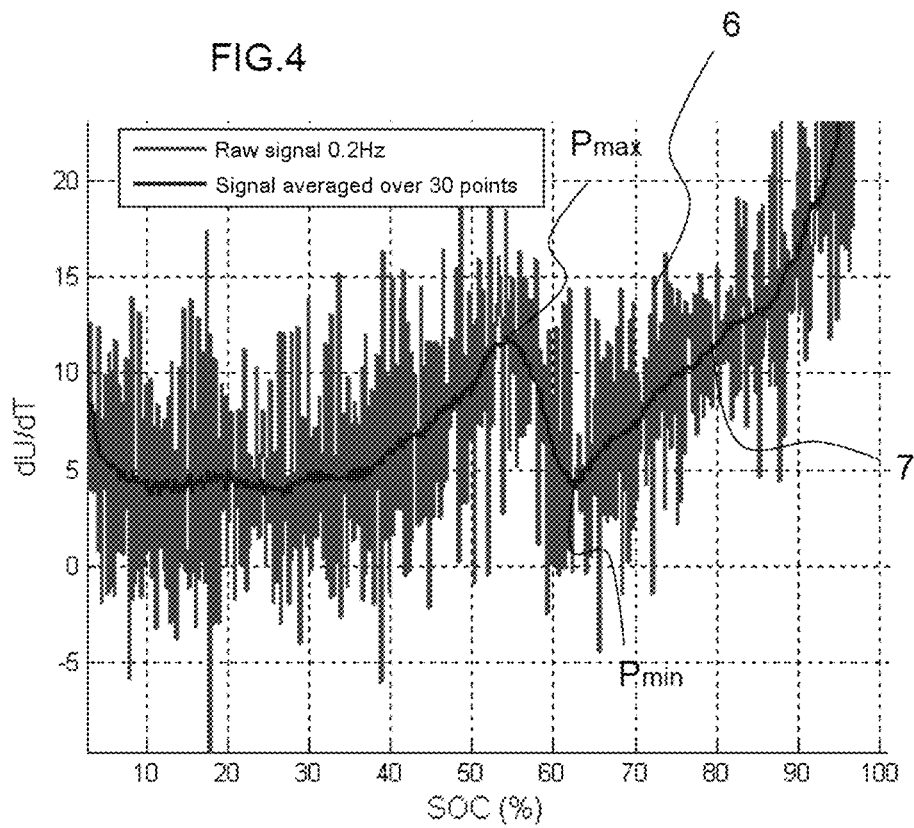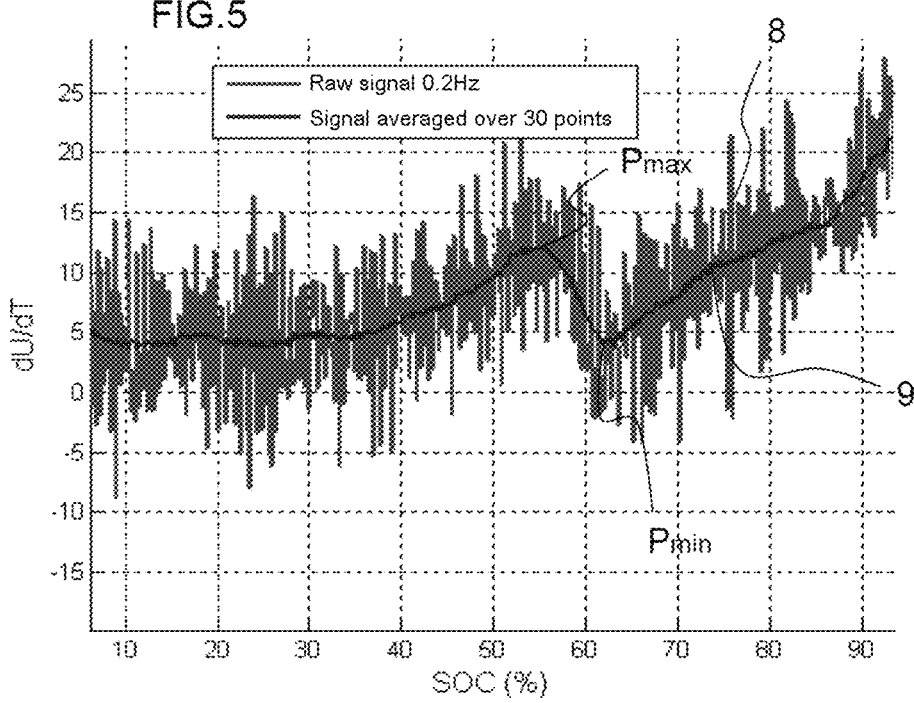

METHOD FOR EVALUATING THE STATE OF CHARGE OF A BATTERY

The invention relates to a method for managing a battery, comprising more particularly a method for evaluating the state of charge and/or the state of health of the battery, on the basis of the detection of a predefined value of a state of charge of a battery, so as especially to control the evolution of its state with time, with its ageing. It also relates to a battery as such, comprising an arrangement making it possible to implement this method. Finally, it also relates to a battery management system implementing this battery management method.

The knowledge of the state of a battery (or electrochemical accumulator) comprises especially the calculation of its state of charge (SOC) at any moment of its existence. Accordingly, a state of charge gauge (or indicator) is generally associated with such a battery. This gauge is managed by a system for managing the battery, which implements the estimation of the state of charge of the battery on the basis of predefined algorithms and of measurements carried out by sensors associated with the battery. With all the prior art solutions, a degradation of this estimation of the state of charge of a battery with time, and with its ageing, is noted. To alleviate this phenomenon, it is known to implement phases termed "resetting of the state of charge gauge", which consist in adaptations with time of the predefined algorithms, for example of the parameters of these algorithms, so as ultimately to allow them to achieve reliable estimation in an enduring manner.

A first procedure of the prior art for implementing a phase of resetting the gauge of state of charge of a battery consists in carrying out a full charge of the battery, and optionally a balancing of this battery when it is composed of several cells assembled according to a series and/or parallel configuration as is for example the case in an architecture often dubbed a "battery pack". When full charge is attained, the gauge is reset by adjusting it to 100%.

A second alternative procedure of the prior art for implementing a phase of resetting the gauge of state of charge of a battery consists in carrying out a full discharge of the battery, which makes it possible to attain a zero state of charge which makes it possible to reset the gauge to 0%.

Thus, these resetting phases ultimately consist of a positioning of the batteries in a totally charged or discharged configuration, for which their real state of charge is known, so as to reset the estimation algorithms on this real value. Naturally, a drawback of these prior art solutions is that they require the regular implementation of a complete charge or discharge of the battery, thereby engendering a loss of time.

Another procedure for resetting the gauge of state of charge of a battery consists in measuring the voltage during a rest phase (without charging current or discharging current). This measurement can be directly related to a state of charge. However, this procedure makes it necessary to have a very precise voltage sensor since, according to the technologies of batteries used, the no-load voltage measurement evolves very finely as a function of its state of charge.

Moreover, the management of the batteries of the prior art often calls upon a complementary indicator representative of the ageing of a battery, often called the "State Of Health", or more simply SOH. In a manner similar to the phenomenon explained with reference to the estimation of the state of charge, an estimation of the SOH requires resetting phases to alleviate the drift of the estimation procedures. Such resetting in general rests upon a phase of complete discharge of the battery followed by a complete charge, to obtain the total of the charge (in ampere-hours) Ah(tr) transmitted to the battery at the instant tr of resetting so that it attains its totally charged and balanced state. This measurement then makes it possible to calculate the state of health SOH(tr) of the battery at the instant tr through the following calculation:

$$SOH(tr)=Ah(tr)/Ah(ti)$$

where Ah(ti) is the total of the charge (in ampere-hours) received by the same battery in its brand new state under the same charging conditions.

This procedure therefore presents the same constraints as for the estimation, those induced by the resetting of the state of charge gauge, since it requires a complete discharge and a complete recharge of the battery.

Thus, a general object of the invention is to propose a solution for estimating the state of charge and/or the state of health of a battery which does not comprise the drawbacks of the prior art.

More particularly, an object of the invention is to propose a solution for estimating the state of charge and/or the state of health of a battery which makes it possible to improve the precision of the estimation while easing the method of estimation.

For this purpose, the invention defines a method for detecting a predefined value of a state of charge of a battery, comprising the following steps:
 charging or discharging the battery, between first and second levels of state of charge;
 measuring the voltage across the terminals of the battery during this charging or discharging;
 evaluating the time derivative of the said voltage;
  detecting at least one particular point of this derivative corresponding to a known and predefined real value of state of charge.

The invention pertains to a method for evaluating the state of charge of a battery, comprising at least one phase of estimating the state of charge of the battery by an algorithm for estimating the state of charge and at least one phase of resetting of the estimation algorithm implemented during the estimation phase, characterized in that the resetting phase comprises the implementation of the following steps:
 detection of a predefined value of a state of charge of the battery by the implementation of the detection method such as described hereinabove, to detect a real value of state of charge at a given instant corresponding to the instant at which the said particular point of the derivative is detected;
 resetting of the estimation algorithm knowing the said real value of state of charge at the said given instant.

The search for a particular point of the curve of time derivative of the voltage across the terminals of the battery can consist of the detection of a maximum or minimum value over a portion of this curve.

During the implementation of the method for detecting a predefined value of a state of charge, the step of evaluating the time derivative of the voltage can comprise a step of instantaneously estimating the time derivative of the voltage and then a step of smoothing the estimations of the derivative.

The smoothing step can comprise a step of calculating an average over a sliding bracket of the estimations of the derivative.

The method for evaluating the state of charge of a battery can comprise a detection step to detect whether or not the state of charge of the battery lies in a span (range) allowing the launching of a resetting phase.

The method for evaluating the state of charge of a battery can comprise the implementation of a phase of resetting of an algorithm for estimating the state of health of the battery if the battery is completely discharged.

The phase of resetting of the algorithm for estimating the state of health of the battery can comprise the following steps:
  charging of the battery,
  estimation of the charge transmitted to the battery from the start of charging,
  observation of the time derivative of the voltage across the terminals of the battery to determine at least one particular point of this derivative,
  resetting of the algorithm for estimating the state of health on the basis of the total charge transmitted to the battery until the said particular point is attained.

The method for evaluating the state of charge of a battery can comprise a step of measurement of temperature of the battery, and a step of cooling or warming of the battery if the temperature of the battery does not lie in a span of plus or minus 20% around a reference temperature value.

The method for evaluating the state of charge of a battery can comprise a step of estimating the dispersion of the states of charge of several sub-assemblies of the battery, and a step of balancing these states of charge if the dispersion lies beyond a threshold, the balancing step being carried out prior to the implementation of the method for detecting a predefined value such as defined previously.

The method for evaluating the state of charge of a battery can comprise the evaluation of the state of charge of a battery comprising one or more elementary battery (batteries) of Lithium Manganese Titanate type, the launching of whose resetting phase by charging of the battery is accepted if the state of charge is less than 40% or if the state of charge is between 56 and 60%, and the step of resetting of the resetting phase can associate a state of charge value lying between 50 and 60%, or indeed between 53 and 56%, for a maximum point $P_{max}$ of the curve of the time derivative of the voltage across the terminals of the battery, the value of whose time derivative lies between 10 and 13 $V \cdot s^{-1}$, or indeed between 11 and 12 $V \cdot s^{-1}$, and/or a state of charge value lying between 60 and 65% for a minimum point $P_{min}$ of this curve, the value of whose time derivative lies between 4 and 5 $V \cdot s^{-1}$, at a temperature between 15 and 30° C. of the battery.

The method for evaluating the state of charge of a battery can comprise the evaluation of the state of charge of a battery comprising one or more elementary battery (batteries) of Lithium Manganese Titanate type, the launching of whose resetting phase by discharging of the battery is accepted if its state of charge is greater than 40% or 50%, and the step of resetting of the resetting phase can associate a state of charge value lying between 32 and 35%, or indeed between 30 and 36%, for a maximum point $P_{max}$ of the curve of the time derivative of the voltage across the terminals of the battery, the value of whose time derivative lies between −5.5 and −4.5 $V \cdot s^{-1}$, and/or a state of charge value lying between 40 and 46% for a minimum point $P_{min}$ of this curve, the value of whose time derivative lies between −10 and −8 $V \cdot s^{-1}$, at a temperature between 15 and 30° C. of the battery.

The method for evaluating the state of charge of a battery can comprise a prior calibration step, consisting of a step of plotting at least one part of the curve of the time derivative of the voltage across the terminals of the battery in the charging or discharging phase, the detection of at least one particular point of this curve, and the measurement of the state of charge associated with the said at least one particular point.

The method for evaluating the state of charge of a battery can implement an evaluation of the state of charge for several elementary batteries of one and the same battery pack.

The invention also pertains to a system comprising a battery and a processor associated with the battery, the processor driving the method for evaluating its state of charge such as explained previously.

The system can comprise at least one sensor of temperature of the battery and at least one sensor of voltage and/or current across the terminals of the battery, and a device for communication of these sensors to the processor to transmit their measurements to it.

The battery can be of Lithium Manganese Titanate type.

The system for managing a battery can comprise at least one processor which implements and drives the method for evaluating the state of charge of the battery such as explained previously.

The invention also pertains to a computer medium readable by a management unit, characterized in that it comprises a recorded computer program comprising computer program code means for implementing and driving the method for evaluating the state of charge of the battery such as explained previously.

These objects, characteristics and advantages of the present invention will be set forth in detail in the following description of a particular embodiment given without limiting effect in conjunction with the attached figures among which:

FIGS. 2 to 5 represent the evolution of the time derivative of the voltage across the terminals of a battery as a function of its state of charge during a charging phase, respectively for various states of ageing of the battery by way of examples.

Figure 1:
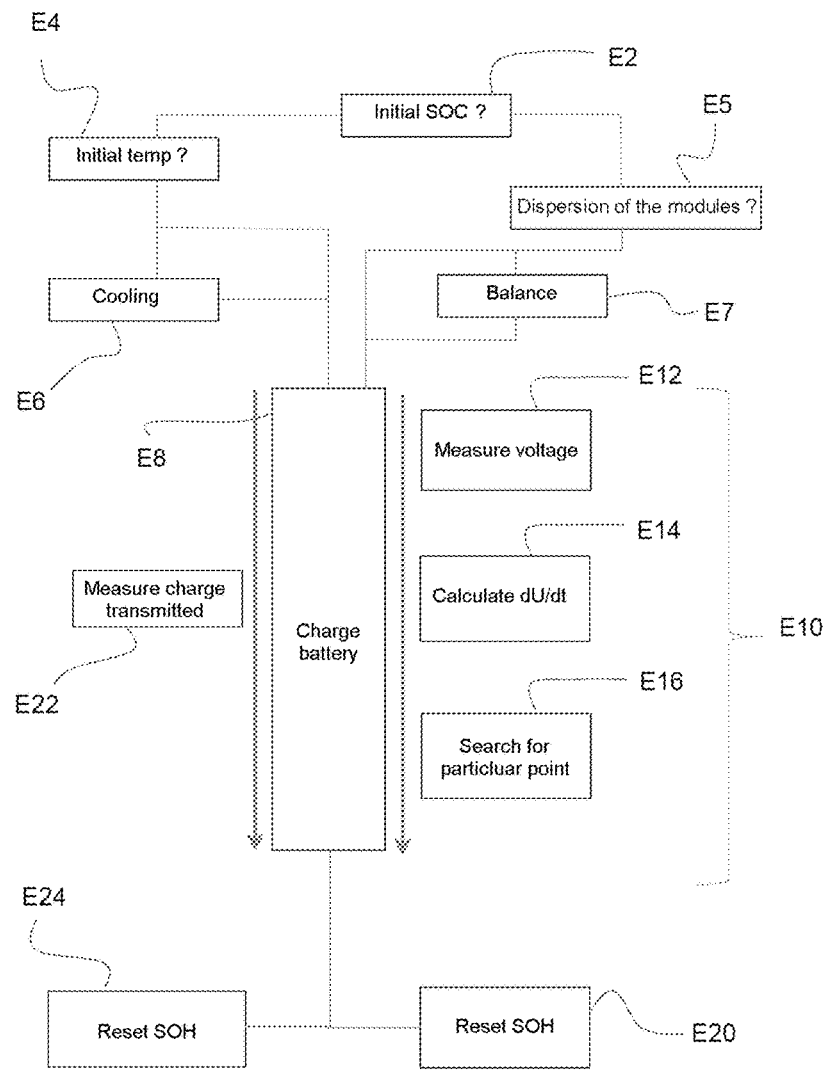
FIG. 1 represents a schematic of a phase of resetting of a method of estimating the state of charge and/or the state of health of a battery according to an embodiment of the invention.
Figure 2:
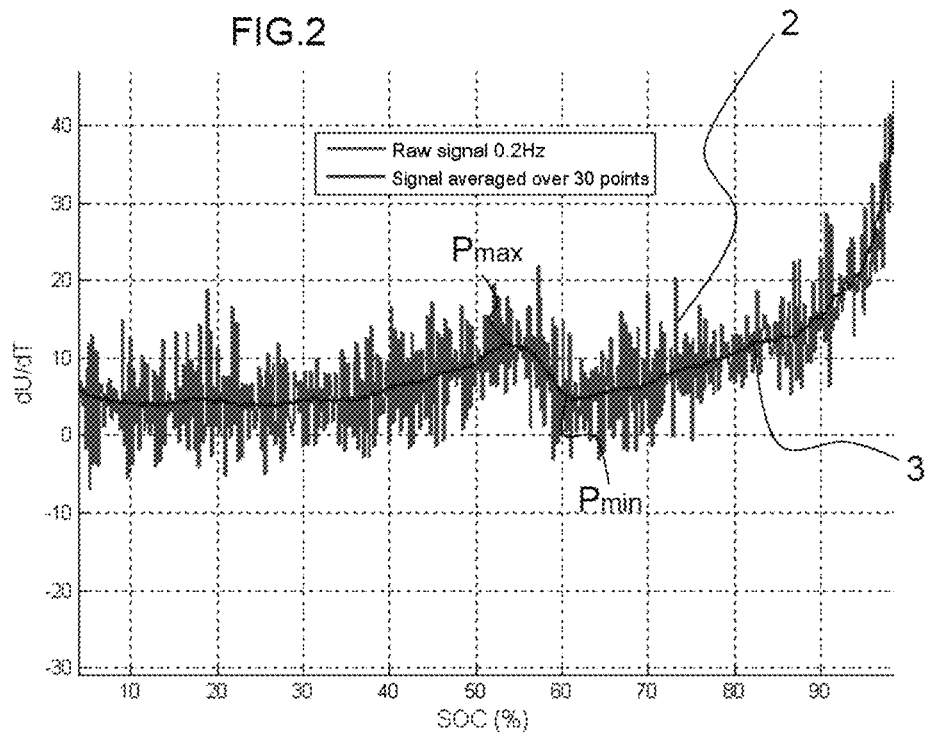
Figure 3:
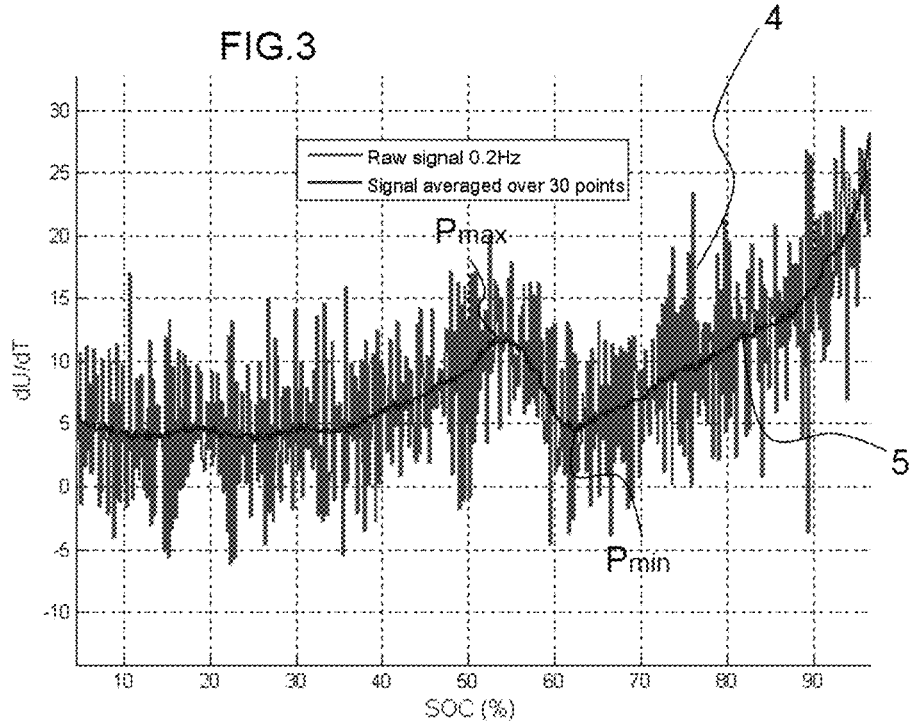

The method of estimating the state of charge of a battery according to an advantageous embodiment of the invention comprises estimation phases, during which an estimation procedure is implemented, which are interrupted by resetting steps. These resetting steps make it possible, on the basis of a precise state of charge value, to reset the calculations implemented during the estimation phases, so as to modify for example the parameters of the calculations implemented by the algorithms used during the estimation phases and to update the values of the parameters so as to take account of the ageing of the battery, but also of a possible drifting of the measurements performed by the sensors, especially the temperature. This updating, or else compensation, is carried out according to the same approach as that explained in relation to the prior art.

However, the resetting phases, which will be detailed subsequently, make it possible to obtain at least one precise and reliable value of the state of charge of a battery, in a simpler and less constraining manner than with the prior art solutions, whatever the ageing of the battery. This approach thus makes it possible to implement the resetting phases according to a more significant occurrence than with the procedures of the prior art, thereby allowing an overall improvement in the precision of the estimation of the state of charge of a battery. This occurrence will be chosen so as to achieve an optimal compromise between high precision of the estimation of the state of charge and the simplicity of the overall method of estimating the state of charge. It is also possible to choose an algorithm for estimating the state of charge which is simpler and less robust, whose decline in performance will be at least compensated by more numerous resetting phases.

A phase of resetting the estimation of the state of charge of a battery according to an embodiment will now be explained. This resetting phase requires the observation of the evolution of the time derivative of the voltage across the terminals of the battery during its charging.

FIGS. 2 to 5 represent by way of example respectively curves 3, 5, 7, 9 showing the evolution of the time derivative of the voltage across the terminals of a battery pack of Lithium Manganese Titanate technology as a function of the state of charge of this battery pack for respectively various states of ageing of the battery, more precisely for respectively 3400, 5800, 8250, and 16900 cycles of charges/discharges of the battery. These curves are established during a phase of charging of the battery. The micro-cycles correspond to partial charges and discharges carried out on 25% of discharge depth, that is to say between 55% and 80% of state of charge SOC. It may be noted that the battery has lost 6% of capacity after 16900 micro-cycles.

The obtaining of these curves 3, 5, 7, 9 can be obtained through the following steps:
  On the basis of the totally discharged state of the battery, charging of the battery under nominal conditions;
  Measurement of the voltage across the terminals of the battery in the course of this charging, with the aid of a measurement sensor, according to a frequency of 0.2 Hz;
  Calculation of the time derivative of the voltage, thereby giving curves 2, 4, 6, 8 in respectively FIGS. 2 to 5;
  Calculation of the sliding average of the previously obtained values of the time derivative of the voltage, over a window of a duration 150 s (this representing 30 values for the chosen frequency): this sliding average makes it possible to plot curves 3, 5, 7, 9 presented hereinabove and to circumvent the oscillations obtained through the instantaneous evaluations, visible in curves 2, 4, 6 and 8.

Naturally, the parameters mentioned hereinabove are so by way of example, and it is possible to obtain such curves under other conditions of electrical charging and/or with other parameters of measurements or of estimations of the voltage of the battery and of calculation of the time derivative of this voltage. Advantageously, this time derivative is filtered, to obtain curves 3, 5, 7, and 9, smoothed with respect to curves 2, 4, 6, and 8 arising from the raw measurements. The filtering operation carried out is of the "low-pass" type, so as to average the values of derivatives calculated.

Curves 3, 5, 7 and 9 show that the time derivative of the voltage exhibits a similar shape whatever the state of ageing of the battery, and exhibit especially two particular points which are on the one hand a maximum $P_{max}$ and on the other hand a minimum $P_{min}$, obtained respectively for values of the state of charge of respectively 54% and 62%, in a manner substantially independent of the ageing of the battery, at a temperature of the battery lying between 15 and 30° C. More generally, the maximum point $P_{max}$ of the curve of the time derivative of the voltage across the terminals of the battery is obtained for a state of charge value lying between 50 and 60%, or indeed between 53 and 56%. Moreover, it is noted that the time derivative of the voltage takes a value of 11.5 V·s$^{-1}$, at this maximum point $P_{max}$, more generally between 10 and 13 V·s$^{-1}$, or indeed between 11 and 12 V·s$^{-1}$. Moreover, the minimum point $P_{min}$ of the curve of the time derivative of the voltage across the terminals of the battery is obtained for a state of charge value lying between 60 and 65%, and the time derivative of the voltage takes a value of 4.3 V·s$^{-1}$ at this minimum point $P_{min}$, more generally between 4 and 5 V·s$^{-1}$.

This finding is true for more or less complex battery architectures, comprising for example a multitude of elementary batteries associated in series and/or parallel, forming a battery pack. Thus, for a given battery, the observation of at least one of these particular points of the curve of time derivative of the voltage of the battery makes it possible to indicate with satisfactory precision a value of the state of charge of the battery, which we consider to be a real value of this state of charge.

The precision is all the more satisfactory as the elementary batteries are balanced and exhibit close charge levels. Stated otherwise, the lower the dispersion of the charge levels of the elementary batteries, the better the precision will be.

On the basis of this finding, the principle implemented in a phase of resetting of a method of estimating the state of charge of a battery consists in an estimation of the curve of time derivative of the voltage across the terminals of the battery during its charging, and in a determination of at least one particular point of this curve, which makes it possible to deduce therefrom precisely a real value of the state of charge of the battery, which serves for the resetting of the model for estimating the state of charge of the battery, used outside of the resetting phases.

The notion of real value of the state of charge is defined as opposed to an estimated value of the state of charge which corresponds to a value calculated by means of an algorithm for calculating the state of charge. The calculation algorithm, or estimation algorithm, use values of physical quantities, for example the voltage across the terminals of the battery, to calculate an estimated value of the state of charge. On the contrary, a particular real value of the state of charge is obtained by detection of a characteristic physical phenomenon making it possible to affirm that the instantaneous value of the state of charge is equal to a known value, predetermined, at the moment of the detection of the said characteristic physical phenomenon.

FIG. 1 illustrates the steps of a phase of resetting of a method of estimating the state of charge of a battery according to an embodiment of the invention, applied by way of example to a battery pack constructed with Lithium Manganese Titanate technology.

In a first step E2, the method verifies whether the state of charge SOC of the battery, such as estimated by the state of charge gauge, even imperfect before its resetting, or by any other means, such as on the basis of a no-load voltage measurement of the electrochemical system of the battery which can also be representative of the state of charge of the battery, lies in an acceptable bracket for the implementation of a resetting phase. It is indeed necessary that it lie in a position which will make it possible to attain one of the noteworthy points of the voltage derivative curve. In the example considered, this bracket is advantageously defined by SOC<40%, thereby making it possible to guarantee the ability to detect the maximum $P_{max}$ of the derivative curve of the voltage during a next charging of the battery. As a variant, this bracket can be between 56 and 60% with the aim of detecting the minimum point $P_{min}$ of the curve. If the predefined condition is not satisfied during this step E2, the resetting phase is not engaged.

In a step E4, the method measures the temperature of the battery, and compares it with a reference temperature, which is in general the ambient temperature, for example close to 20° C. and preferably between 15 and 30° C. If this temperature is greater than the reference temperature, a step E6 of cooling of the battery is preferably implemented, until it attains substantially the reference temperature sought, or a value not further than 20% from this reference temperature. As a variant, a warming of the battery can also be implemented if the latter is at too low a temperature.

Moreover, in a step E5, the method implements a step of measuring the dispersion of the states of charge of sub-assemblies of the battery. Accordingly, the method implements a comparison of the states of charge of each sub-assembly, obtained by a gauge specifically targeting each sub-assembly. This comparison can rest upon a statistical calculation making it possible to measure the dispersion of the values obtained. In case of dispersion exceeding a certain threshold, a balancing step E7 is implemented, making it possible to attain a substantially identical state of charge of all the sub-assemblies of the battery. This balancing can comprise the discharging of the most charged sub-assemblies. By way of nonlimiting indication, the acceptable dispersion threshold can be fixed equal to 1 or to a few percent of the average value of the levels of states of charge of the sub-assemblies.

The previous steps E4 to E7 make it possible to position the battery in a favourable initial state, so as to attain the maximum performance of the method which will be described subsequently. The adjustment of the temperature E4, E6 and the adjustment of the state of charge of the sub-assemblies of the battery E5, E7 can be implemented in an arbitrary order. However, these adjustments remain optional. As a variant, just one of the two envisaged adjustments may be implemented.

Thereafter, the method continues by the turning on of a step E8 of charging the battery, under conditions of predefined charging current, preferably at constant current. Moreover, the charging conditions are also preferably chosen so as to maintain this temperature of the battery substantially constant, by avoiding for example heavy loadings. The nominal charging conditions, given by the constructor, represent by way of example a good solution.

During this step E8 of charging the battery, the resetting phase implements a simultaneous step E10 of observing the curve formed by the evolution of the time derivative of the voltage, according to the same approach as that explained previously, on the basis of a periodic measurement of the voltage across the terminals of the battery.

Thus, according to this embodiment, this step E10 comprises the following sub-steps:
  Measurement of the voltage E12 across the terminals of the battery according to a predefined frequency;
  Estimation of the time derivative E14 of this voltage, for example on the basis of an average over a sliding bracket;
  Search for a particular point E16 of the curve obtained through this time derivative.

The estimation of the time derivative E14 of the voltage can be performed according to the procedure explained previously.

This step of searching for a particular point E16 can be implemented by any known mathematical or calculation procedure. Advantageously, this particular point is a maximum or a minimum, over a certain portion of the observed curve, whose detection is effected through the detection of a change of slope of the curve on either side of this point. When this particular point is determined, the method deduces therefrom the corresponding value of the state of charge of the battery, and then engages a final step E20 of resetting the estimation calculation: this resetting is then done in a manner similar to the prior art; the invention does not specifically pertain to the latter step.

It is noted that steps E8 and E10 explained hereinabove correspond in fact to a method for detecting a predefined value of a state of charge of a battery, to which the invention also pertains.

Note, the method of estimating state of charge according to the embodiment comprises a prior calibration step E0, which makes it possible to determine the particular points of the curve of the time derivative of the voltage of the battery during its charging, at the reference temperature and under chosen charging conditions, advantageously the nominal conditions. This calibration step E0 makes it possible naturally to associate the values of state of charge of the battery with these particular points. This step can be carried out for each brand new battery, before it is put into service, for example by the constructor himself, or for a whole family of batteries, or indeed subsequently on a battery that is not necessarily brand new, for example by a user.

The method described hereinabove achieves the objects sought and exhibits the advantage of not requiring total charging or discharging of the battery, nor any rest phase, for the phase of resetting of its method of estimating its state of charge, but can operate over a short duration of charging of the battery, since it is possible to engage the resetting phase in an initial state of the battery close to the particular point to be detected, which terminates the resetting phase. Thus, the resetting phase becomes much less constraining.

The invention also pertains to a battery associated with a management system, which comprises hardware means and/or software means, at least one processor, to implement the method of battery management, more precisely of estimation of the state of charge and the implementation of the resetting phases, which is detailed hereinabove. This management system drives especially the steps of calculation, measurement and/or estimations of physical quantities, such as temperature, current, voltage, etc. This battery management system may or may not be integrated within the structure of the battery. Advantageously, the battery comprises at least one temperature sensor for measuring its temperature and at least one voltage measurement sensor, these sensors being linked by a means of communication with the processor. The management system moreover comprises a memory for storing all or some of the values measured and/or calculated in the various steps of the method.

The previous embodiment has been described for best estimating the state of charge of a battery. In the case of a battery comprising a battery pack architecture, it is possible to implement the estimation of the state of charge for the whole of the battery pack and/or for elementary batteries or arbitrary sub-assemblies of the battery pack, so as to detect the dispersions between these sub-assemblies.

In the case where the resetting phase is implemented on the basis of a totally discharged state of the battery, it is possible to implement in a very similar manner a phase of resetting of a method of estimating the state of health SOH of the battery. The state of health of a battery is defined on the basis of the reference capacity of the battery, called Cref. This reference capacity represents the maximum amount of charge that the battery, initially charged, can yield in the course of a discharge. It is defined thus by considering a charge and discharge performed under nominal conditions (loadings or profile of current, temperature, criteria for end of charging and discharging). This reference capacity decreases with time, since with its ageing, the battery becomes less efficacious. Thus, if Cref(t0) denotes the reference capacity of the battery at the initial instant and Cref(t) its reference capacity at an instant t, the state of health SOH(t) of the battery at the instant t is defined in the following manner:

$$SOH(t)=Cref(t)/Cref(t0).$$

The phase of resetting the state of health of the battery comprises a step of measuring the charge Ah(tr) transmitted E22 to the battery between its discharged state and its intermediate state corresponding to a particular point for which its state of charge is known, at the instant tr of resetting.

This same measurement is carried out in the brand new state of the battery, for example during the calibration step, which thus makes it possible to measure and to store the charge Ah(t0) transmitted to the battery up to the same particular point in the brand new state of the battery.

On the basis of these calculations, the method deduces therefrom a real value of the state of health of the battery at the instant tr, through the following formula:

$$SOH(tr)=Ah(tr)/Ah(t0)$$

This real value is thereafter used for a step of resetting E24 of the algorithm for calculating the state of health.

This phase of resetting of the algorithm for estimating the state of health can be combined with the phase of the method of estimating the state of charge, or indeed be distinct and independent.

The resetting phases described previously are effected with the aid of a partial charge of a battery. As a variant, similar steps can be implemented with partial discharges of a battery.

Figure 6:
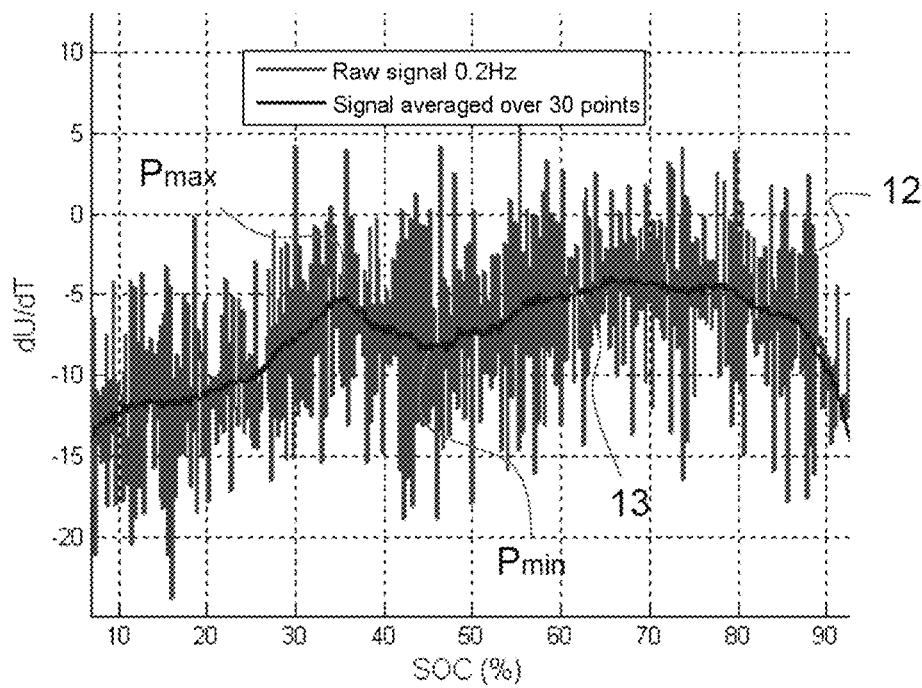
FIGS. 6 to 8 represent the evolution of the time derivative of the voltage across the terminals of a battery as a function of its state of charge during a discharging phase, respectively for various states of ageing of the battery by way of examples.
Figure 7:
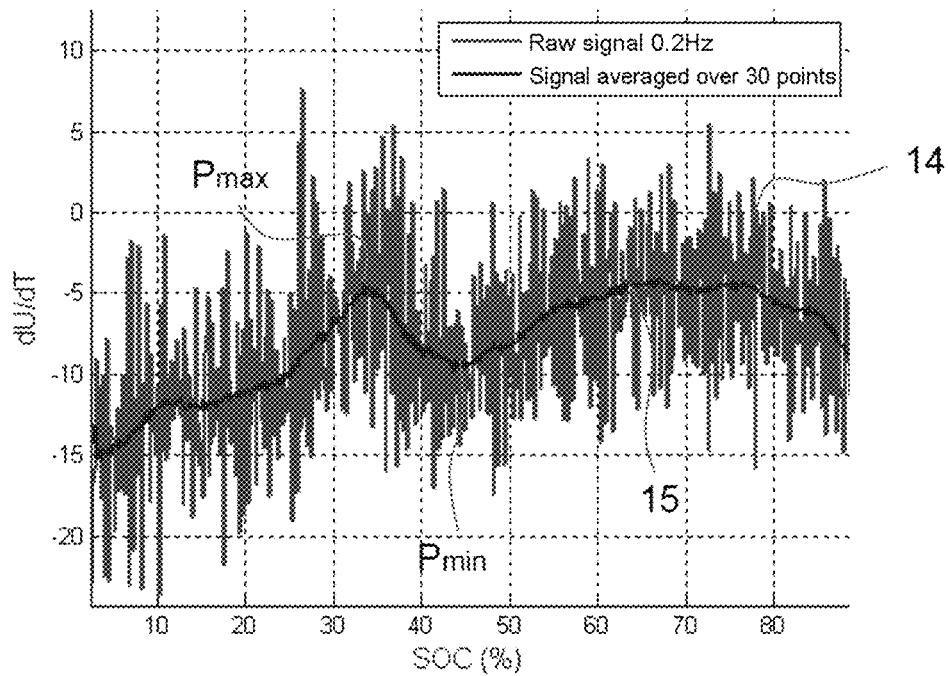
Figure 8:
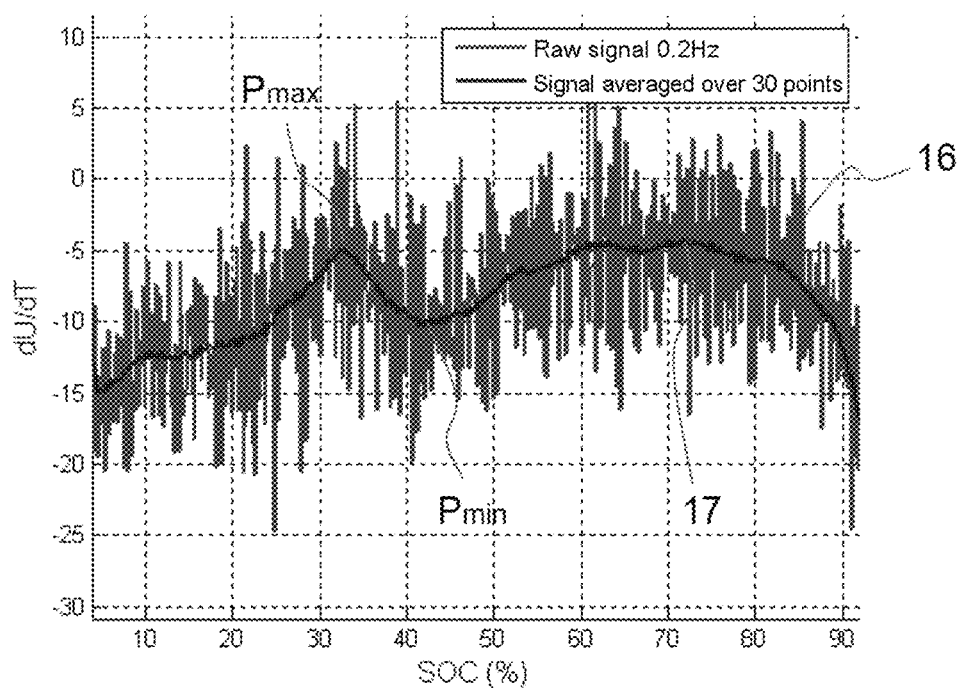

Indeed, FIGS. 6 to 8 represent by way of example respectively curves 13, 15, and 17 showing the evolution of the time derivative of the voltage across the terminals of a battery pack of Lithium Manganese Titanate technology as a function of the state of charge of this battery pack for respectively various states of ageing of the battery, more precisely for respectively 3400, 8000, and 16900 cycles of charges/discharges of the battery. These curves are established during a phase of discharging of the battery, contrary to curves 3, 5, 7 and 9 studied previously.

The obtaining of these curves 13, 15, and 17 can be effected in a manner similar to curves 3, 5, 7 and 9 described previously but on the basis of the totally charged state of the battery and in the course of its discharging. Advantageously, these curves represent the filtered time derivative, to obtain smoothed curves, with respect to curves 12, 14, and 16 arising from the instantaneous measurements.

Curves 13, 15, and 17 show that the time derivative of the voltage exhibits a similar shape whatever the state of ageing of the battery, and exhibit especially two particular points which are on the one hand a maximum $P_{max}$ and on the other hand a minimum $P_{min}$, obtained respectively for values of the state of charge of respectively 30% and 50%, in a manner substantially independent of the ageing of the battery, at a temperature between 15 and 30° C. of the battery. More generally, the maximum point $P_{max}$ of the curve of the time derivative of the voltage across the terminals of the battery is obtained for a state of charge value lying between 30 and 36%, or indeed between 32 and 35%. Moreover, it is noted that the time derivative of the voltage takes a value close to $-5$ $V \cdot s^{-1}$ at this maximum point $P_{max}$, more generally between $-5.5$ and $-4.5$ $V \cdot s^{-1}$. Moreover, the minimum point $P_{min}$ of the curve of the time derivative of the voltage across the terminals of the battery is obtained for a state of charge value lying between 40 and 46%, and the time derivative of the voltage takes a value between $-10$ and $-8$ $V \cdot s^{-1}$ at this minimum point $P_{min}$.

Thus, it is apparent that the previously described method for evaluating the state of charge of a battery can be implemented in a very similar manner by replacing the charging step E8 by a discharging step E8. Note, however, it is necessary to take into account the fact that the particular points $P_{max}$ and $P_{min}$ are different in this approach and it is therefore necessary to apply the same method by searching for these different particular points.

Thus, in the first step E2 where the method verifies whether the state of charge SOC of the battery lies in an acceptable bracket for the implementation of a resetting phase, this bracket is advantageously defined by SOC<50%.

Moreover, and generally, it is possible to reset the SOH during a charge or a discharge by evaluating a charge in Ah between two known SOC levels. Thus, in a charging phase, it is possible to reset the SOH by estimating the charge in Ah between a state of charge SOC equal to 0% and a level equal to the SOC of a particular point "under charge" (for example 60%) or by estimating the charge in Ah between this particular point and a state of charge SOC equal to 100%. Likewise, during a discharge, it is possible to reset the SOH by estimating the charge in Ah between a state of charge SOC of 100% and a level equal to the SOC of a particular point "under discharge" or by estimating the charge in Ah between this particular point and a state of charge SOC equal to 0%. As explained previously, the present SOH is obtained by ratio between the charge Ah(tr) between two known SOC levels and the charge in Ah(t0) between these same SOC levels in the brand new state of the battery.

The invention claimed is:

1. Method for evaluating the state of charge of a battery comprising:
   at least one phase of estimating the state of charge of the battery by an estimation algorithm for estimating the state of charge, and
   at least one phase of resetting the estimation algorithm implemented during the estimation phase, wherein the resetting phase comprises:
      detecting a real value of the state of charge of the battery at an instant given by:
         charging or discharging the battery, between first and second levels of the state of charge;
         measuring the voltage across terminals of the battery during the charging or discharging;
         evaluating a time derivative of the voltage; and
         detecting at least one particular point of the time derivative corresponding to a known and predefined real value of the state of charge, and
      resetting the estimation algorithm knowing the real value of state of charge at the given instant.

2. The method for evaluating the state of charge of a battery according to claim 1, wherein the detecting of the at least one particular point of a curve of the time derivative of the voltage across the terminals of the battery comprises a search for the at least one particular point, wherein the search comprises detecting a maximum or minimum value over a portion of the curve.

3. The method according to claim 1, wherein, during implementation of the detecting of the predefined real value of the state of charge, the evaluation of the time derivative of the voltage comprises instantaneously estimating the time derivative of the voltage to obtain estimations of the time derivative, and smoothing the estimations of the time derivative.

4. The method for evaluating the state of charge of a battery according to claim 3, wherein the smoothing comprises calculating an average over a sliding bracket of the estimations of the time derivative.

5. The method for evaluating the state of charge of a battery according to claim 1, comprising detecting whether or not the state of charge of the battery lies in a range allowing launching a resetting phase.

6. The method for evaluating the state of charge of a battery according to claim 1, comprising implementing a phase of resetting an algorithm for estimating a state of health of the battery if the battery is completely discharged.

7. The method for evaluating the state of charge of a battery according to claim 6, wherein the phase of resetting the algorithm for estimating the state of health of the battery comprises:
   charging the battery,
   estimating a charge transmitted to the battery from the start of the charging,
   observing a time derivative of the voltage across the terminals of the battery to determine at least one particular point of the time derivative,
   resetting the algorithm for estimating the state of health on the basis of a total charge transmitted to the battery until the particular point is attained.

8. The method for evaluating the state of charge of a battery according to claim 1, comprising measuring a temperature of the battery, and cooling or warming the battery if the temperature of the battery does not lie in a range of plus or minus 20% around a reference temperature value.

9. The method for evaluating the state of charge of a battery according to claim 1, comprising estimating a dispersion of states of charge of several sub-assemblies of the battery, and balancing the states of charge if the dispersion lies beyond a threshold, the balancing being carried out prior to implementation of the detecting of the predefined real value.

10. The method for evaluating the state of charge of a battery according to claim 1, wherein the battery comprises one or more elementary Lithium Manganese Titanate battery (batteries), and wherein the evaluating of the state of charge of the battery comprises launching of a resetting phase of the elementary battery (batteries) by charging the battery being accepted if the state of charge is less than 40% or if the state of charge is between 56 and 60%, and wherein the resetting of the resetting phase associates (i) a first value of the state of charge lying between 50 and 60%, for a maximum point $P_{max}$ of a curve of the time derivative of the voltage across the terminals of the battery, a first value of the time derivative lying between 10 and 13 V·s$^{-1}$, and (ii) a second value of the state of charge lying between 60 and 65% for a minimum point $P_{min}$ of the curve, a second value of the time derivative lying between 4 and 5 V·s$^{-1}$, at a temperature between 15 and 30° C. of the battery.

11. The method for evaluating the state of charge of a battery according to claim 1, wherein the battery comprises one or more elementary Lithium Manganese Titanate battery (batteries), and wherein the evaluating of the state of charge of the battery comprises launching of a resetting phase of the elementary battery (batteries) by discharging of the battery being accepted if the state of charge of the battery is greater than 40%, and wherein the resetting of the resetting phase associates at least one of (i) a first value of the state of charge lying between 30 and 36%, for a maximum point $P_{max}$ of a curve of the time derivative of the voltage across the terminals of the battery, a first value of the time derivative lying between −5.5 and −4.5 V·s$^{-1}$, and (ii) a second value of the state of charge lying between 40 and 46% for a minimum point $P_{min}$ of the curve, a second value of the time derivative lying between −10 and −8 V·s$^{-1}$, at a temperature between 15 and 30° C. of the battery.

12. The method for evaluating the state of charge of a battery according to claim 1, comprising a prior calibration phase comprising plotting at least one part of a curve of the time derivative of the voltage across the terminals of the battery during the charging or discharging, detecting at least one particular prior calibration point of the curve, and measuring the state of charge associated with the at least one particular prior calibration point.

13. The method for evaluating the state of charge of a battery according to claim 1, which implements evaluating the state of charge for each of several elementary batteries of a single battery pack.

14. System comprising a battery and a processor associated with the battery, wherein the system is configured so that the processor drives the system to implement an evaluation of a state of charge of a battery by performing:
   at least one phase of estimating the state of charge of the battery by an estimation algorithm for estimating the state of charge, and
   at least one phase of resetting the estimation algorithm implemented during the estimation phase, wherein the resetting phase comprises:
      detecting a real value of the state of charge of the battery at an instant given by:
         charging or discharging the battery, between first and second levels of the state of charge;
         measuring the voltage across terminals of the battery during the charging or discharging;
         evaluating a time derivative of the voltage; and
         detecting at least one particular point of the time derivative corresponding to a known and predefined real value of the state of charge, and
      resetting the estimation algorithm knowing the real value of state of charge at the given instant.

15. The system according to claim 14, comprising at least one sensor of temperature of the battery, at least one sensor of at least one of voltage and current across the terminals of the battery, and a device for communication of the sensors to the processor to transmit measurements by the sensors to the processor.

16. The system according to claim 14, wherein the battery is a Lithium Manganese Titanate battery.

17. Computer medium readable by a management unit, comprising a recorded computer program comprising computer program code executable to cause a management unit to implement an evaluation of a state of charge of a battery by performing:
   at least one phase of estimating the state of charge of the battery by an estimation algorithm for estimating the state of charge, and
   at least one phase of resetting the estimation algorithm implemented during the estimation phase, wherein the resetting phase comprises:

detecting a real value of the state of charge of the battery at an instant given by:
charging or discharging the battery, between first and second levels of the state of charge;
measuring the voltage across terminals of the battery during the charging or discharging;
evaluating a time derivative of the voltage; and
detecting at least one particular point of the time derivative corresponding to a known and predefined real value of the state of charge, and
resetting the estimation algorithm knowing the real value of state of charge at the given instant.

18. The method for evaluating the state of charge of a battery according to claim 10, wherein the resetting of the resetting phase associates the first value of the state of charge lying between 53 and 56%, for the maximum point $P_{max}$ of the curve of the time derivative of the voltage across the terminals of the battery, the first value of the time derivative lying between 11 and 12 $V \cdot s^{-1}$.

19. The method for evaluating the state of charge of a battery according to claim 11, wherein the resetting of the resetting phase associates the first value of the state of charge lying between 32 and 35%, for the maximum point $P_{max}$ of the curve of the time derivative of the voltage across the terminals of the battery.

* * * * *